(12) United States Patent
Woehl et al.

(10) Patent No.: US 11,264,199 B2
(45) Date of Patent: Mar. 1, 2022

(54) ELECTROCHEMICAL MEASUREMENT OF ELECTRON BEAM-INDUCED PH CHANGE DURING LIQUID CELL ELECTRON MICROSCOPY

(71) Applicant: UNIVERSITY OF MARYLAND, COLLEGE PARK, College Park, MD (US)

(72) Inventors: Taylor Woehl, Columbia, MD (US); Mei Wang, Silver Spring, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 0 days.

(21) Appl. No.: 16/919,707

(22) Filed: Jul. 2, 2020

(65) Prior Publication Data
US 2021/0249219 A1 Aug. 12, 2021

Related U.S. Application Data

(60) Provisional application No. 62/972,443, filed on Feb. 10, 2020.

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01); *H01J 2237/2004* (2013.01); *H01J 2237/2594* (2013.01)

(58) Field of Classification Search
CPC .... H01J 37/20; H01J 37/28; H01J 2237/2004; H01J 2237/2594
USPC ............. 250/306, 307, 309, 310, 311, 492.1, 250/492.3
See application file for complete search history.

(56) References Cited

U.S. PATENT DOCUMENTS

2010/0185143 A1* 7/2010 Uhland ............... A61M 5/1723
604/67
2016/0377572 A1* 12/2016 Gorodetsky ....... G01N 27/4167
435/173.4

OTHER PUBLICATIONS

Cattrall, R. W. et al., Coated wire ion-selective electrodes. Analytical Chemistry 1971, 43 (13), 1905-1906.
(Continued)

*Primary Examiner* — Nicole M Ippolito
(74) *Attorney, Agent, or Firm* — Quarles & Brady LLP

(57) ABSTRACT

A microfluidic cell system to measure proton concentration in a fluid sample. The microfluidic cell system includes: a first microchip and a second microchip dimensioned to permit electron beam scanning of a fluid sample; a first membrane attached to the first microchip; a second membrane attached to the second microchip, the first membrane and the second membrane being disposed adjacent to one another with a space for the fluid sample therebetween, and the first membrane and the second membrane including a region of the fluid sample in which an electron beam is scanned; a first electrode patterned onto the first membrane and positioned a first distance from the region; a second electrode patterned onto the first microchip and positioned a second distance from the region, the first distance being less than the second distance; and a potentiostat in communication with the first electrode and the second electrode.

20 Claims, 10 Drawing Sheets
(8 of 10 Drawing Sheet(s) Filed in Color)

(56) References Cited

OTHER PUBLICATIONS

Chen, Q. et al. 3D Motion of DNA-Au Nanoconjugates in Graphene Liquid Cell Electron Microscopy. Nano Letters 2013, 13 (9), 4556-4561.
Cho, H. et al. The Use of Graphene and Its Derivatives for Liquid-Phase Transmission Electron Microscopy of Radiation-Sensitive Specimens. Nano Letters 2017, 17 (1), 414-420.
De Jonge, et al. Electron microscopy of specimens in liquid. Nature Nanotechnology 2011, 6 (11), 695-704.
De Jonge, et al. Electron microscopy of whole cells in liquid with nanometer resolution. Proceedings of the National Academy of Sciences of the United States of America 2009, 106 (7), 2159-2164.
Dimemmo, L. M. et al, Real-time observation of protein aggregates in pharmaceutical formulations using liquid cell electron microscopy. Lab on a Chip 2017, 17 (2), 315-322.
Grogan, J. M. et al. Bubble and Pattern Formation in Liquid Induced by an Electron Beam. Nano Letters 2014, 14 (1), 359-364.
Gupta, T. et al, Spatially dependent dose rate in liquid cell transmission electron microscopy. Nanoscale 2018, 10 (16), 7702-7710.
Li, D. S. et al, Direction-Specific Interactions Control Crystal Growth by Oriented Attachment. Science 2012, 336 (6084), 1014-1018.
Moser, T. H. et al. The role of electron irradiation history in liquid cell transmission electron microscopy. Science Advances 2018, 4 (4).
O'Brien, E. P. et al. Effects of pH on Proteins: Predictions for Ensemble and Single-Molecule Pulling Experiments. Journal of the American Chemical Society 2012, 134 (2), 979-987.
Parent, L. R. et al, Tackling the Challenges of Dynamic Experiments Using Liquid-Cell Transmission Electron Microscopy. Accounts of Chemical Research 2018, 51 (1), 3-11.
Parent, L. R. et al. Directly Observing Micelle Fusion and Growth in Solution by Liquid-Cell Transmission Electron Microscopy. Journal of the American Chemical Society 2017, 139 (47), 17140-17151.
Park, J. et al. Direct Observation of Wet Biological Samples by Graphene Liquid Cell Transmission Electron Microscopy. Nano Letters 2015, 15 (7), 4737-4744.
Rindelaub, J. D. et al, Direct Measurement of pH in Individual Particles via Raman Microspectroscopy and Variation in Acidity with Relative Humidity The Journal of Physical Chemistry A 2016, 120 (6), 911-917.
Ross, F. M., Opportunities and challenges in liquid cell electron microscopy. Science 2015, 350 (6267).
Schmidt, K. H., Electrical conductivity techniques for studying the kinetics of radiation-induced chemical reactions in aqueous solutions. International Journal for Radiation Physics and Chemistry 1972, 4 (4), 439-468.
Schneider, N. M. et al, Electron-Water Interactions and Implications for Liquid Cell Electron Microscopy. Journal of Physical Chemistry C 2014, 118 (38), 22373-22382.
Wadell, C. et al, Nanocuvette: A Functional Ultrathin Liquid Container for Transmission Electron Microscopy. ACS Nano 2017, 11 (2), 1264-1272.
Wang, C. et al, High-Resolution Electron Microscopy and Spectroscopy of Ferritin in Biocompatible Graphene Liquid Cells and Graphene Sandwiches. Advanced Materials 2014, 26 (21), 3410-3414.
Woehl, T. J. et al. Defining the radiation chemistry during liquid cell electron microscopy to enable visualization of nanomaterial growth and degradation dynamics. Journal of Microscopy 2017, 265 (2), 135-147.
Woehl, T. J. et al. Direct in Situ Determination of the Mechanisms Controlling Nanoparticle Nucleation and Growth. Acs Nano 2012, 6 (10), 8599-8610.
Woehl, T. J. et al. Experimental procedures to mitigate electron beam induced artifacts during in situ fluid imaging of nanomaterials. Ultramicroscopy 2013, 127, 53-63.
Zhou, J. et al. A pH sensitive ratiometric fluorophore and its application for monitoring the intracellular and extracellular pHs simultaneously. Journal of Materials Chemistry B 2013, 1 (5), 661-667.

* cited by examiner

ELECTROCHEMICAL MEASUREMENT OF ELECTRON BEAM-INDUCED PH CHANGE DURING LIQUID CELL ELECTRON MICROSCOPY

CROSS-REFERENCE TO RELATED APPLICATIONS

This present application claims priority to U.S. Provisional Application No. 62/972,443, filed Feb. 10, 2020, the content of which is incorporated herein by reference in its entirety.

BACKGROUND

Liquid phase transmission electron microscopy (LP-TEM) enables imaging of the structure and dynamics of nanomaterials, energy materials, biological cells, and biomolecules in their native hydrated state. LP-TEM has become particularly important in the fields of materials chemistry and battery electrochemistry, where LP-TEM experiments have both challenged classical interpretations of these systems and revealed entirely new insights based on nanoscale dynamic imaging

SUMMARY

As researchers begin to apply liquid cell electron microscopy (LP-TEM) to image dynamics and structure of electron beam-sensitive biological and soft nanomaterials in liquid, a major challenge in the field is to quantify local electron beam-induced changes to sample chemistry during imaging. Solution chemistry is modified by electron beam-induced production of radicals, molecules (protons, hydroxide ions, hydrogen peroxide), and dissolved gas (hydrogen and oxygen gas). Embodiments of the invention demonstrate direct electrochemical measurements of local electron beam-induced pH changes during LP-TEM imaging using electrochemical impedance spectroscopy (EIS) to detect changes in solution resistance resulting from electron beam-induced changes to solution pH. This strategy relies on the contrasting reactivity and diffusion behavior of electron beam generated species: protons and hydroxide ions are able to diffuse throughout the LP-TEM microchannel while reactive radicals recombine before they are able to diffuse away. This bifurcated behavior enables selectively measuring solution resistance changes resulting only from pH changes. The sensitivity of solution resistance to solution pH over a wide pH range of 2-10 can be illustrated. Reaction-diffusion simulations demonstrate the bifurcated behavior of molecular and radical ionic species and confirm that EIS measurements are selectively probing proton concentrations. Embodiments of the invention demonstrate effects of electron beam current and magnification on solution resistance and show correlations consistent with reaction-diffusion simulations of radiolytic pH changes. Embodiments of the invention further illustrate that ionic species specificity can be achieved without ion selective electrodes by taking advantage of differences in ion diffusion and radical recombination rates.

Embodiments of the invention provide a microfluidic cell system to measure proton concentration in a fluid sample. The microfluidic cell system includes: a first microchip and a second microchip dimensioned to permit electron beam scanning of a fluid sample; a first membrane attached to the first microchip; a second membrane attached to the second microchip, the first membrane and the second membrane being disposed adjacent to one another with a space for the fluid sample therebetween, and the first membrane and the second membrane including a region of the fluid sample in which an electron beam is scanned; a first electrode patterned onto the first membrane and positioned a first distance from the region; a second electrode patterned onto the first microchip and positioned a second distance from the region, the first distance being less than the second distance; and a potentiostat in communication with the first electrode and the second electrode.

Other embodiments of the invention provide an apparatus for measuring an electron beam-induced pH change during electron microscopy. The apparatus includes: a first microchip including a first microelectrode patterned thereon; a second microchip disposed adjacent to the first microchip to create a microfluidic channel therebetween; and a free standing membrane attached to the first microchip and configured for transmission electron microscopy observations, the free standing membrane having a second microelectrode and a third microelectrode patterned thereon.

Still other embodiments provide a method of determining local pH of a sample in a microfluidic cell. The method includes: applying an electron beam to a region of the microfluidic cell containing the sample; applying, using a plurality of electrodes disposed within the microfluidic cell, a sinusoidal electric potential to the sample based on applying the electron beam; measuring, based on applying the sinusoidal electric potential, impedance in the plurality of electrodes using electrochemical impedance spectroscopy; calculating a solution conductivity from the measured impedance; determining a total concentration of protons and pH gradient between two electrodes; and back calculating from the total concentration of protons to determine the local pH of the sample within the region.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are incorporated in and form a part of this specification, illustrate embodiments of the invention and, together with the description, serve to explain the principles of embodiments of the invention:

FIG. 1b is a plan view schematic drawing of the microfluidic chamber of FIG. 1a.

FIG. 5a is a finite element analysis simulation of a proton concentration as a function of position along the x-axis from a center of the image area (x=0, y=0).

DETAILED DESCRIPTION

Figure 1A:
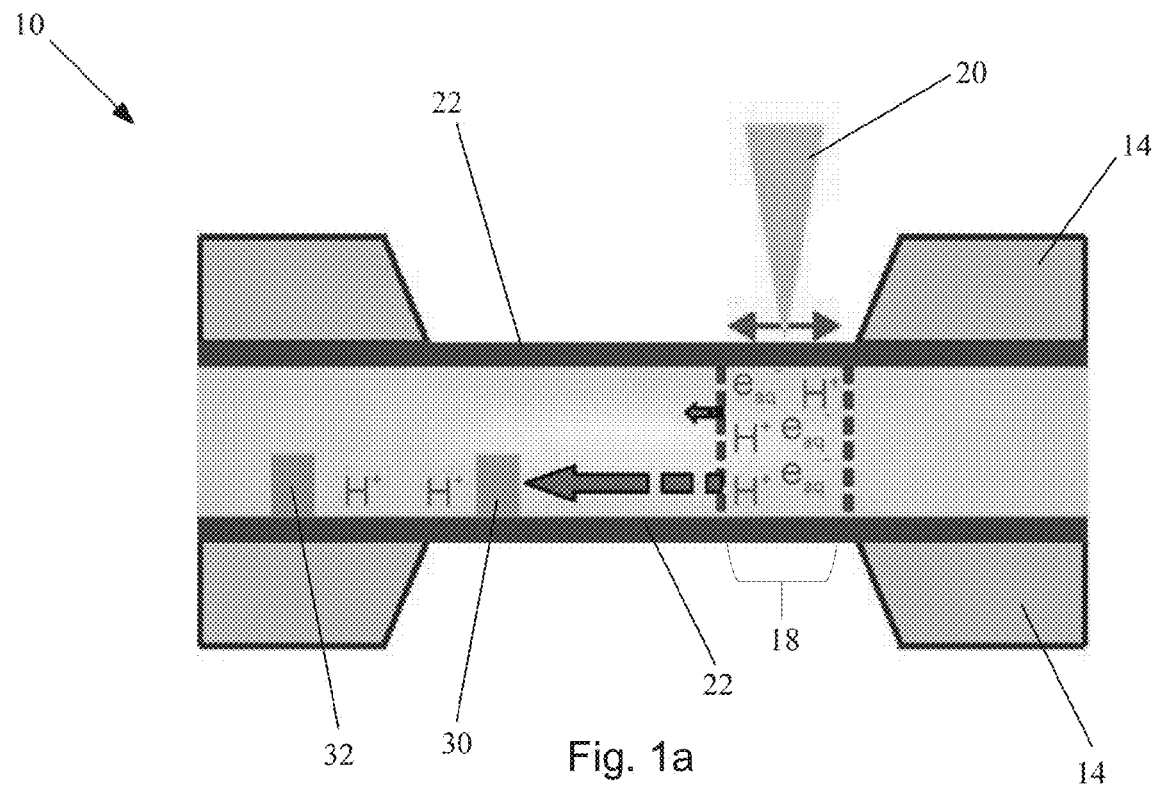
FIG. 1a is a cross-sectional schematic drawing of a microfluidic chamber for LP-TEM imaging including microfluidic chips and microelectrodes for remote sensing of electron beam-induced pH change.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The invention may be described herein in terms of functional components and various processing steps. It should be appreciated that such block components may be realized by any number of hardware, software, and/or firmware components configured to perform the specified functions. For example, an embodiment may employ various integrated circuit components, e.g., memory elements, digital signal processing elements, logic elements, diodes, look-up tables, etc., which may carry out a variety of functions under the control of one or more microprocessors or other control devices. Other embodiments may employ program code, or code in combination with other circuit components. Certain embodiments may include a processor or microprocessor in communication with one or more components of the disclosed apparatus or system as well as a memory in communication with the processor or microprocessor where the memory has stored thereon a set of instructions which, when executed by the processor or microprocessor, carry out the procedures disclosed herein.

The term "about," as used herein, refers to variation in the numerical quantity that may occur, for example, through typical measuring and manufacturing procedures used for articles of manufacture that may include embodiments of the disclosure herein. Throughout the disclosure, the terms "about" and "approximately" refer to a range of values ±5% of the numeric value that the term precedes.

Emerging frontiers of liquid-phase transmission electron microscopy (LP-TEM) imaging include imaging of soft materials, such as covalent organic frameworks and polymer vesicles, and biological materials, including cells, DNA-nanocrystal hybrids, protein aggregates, viruses and phages, membrane proteins, and even single proteins. All organic-based materials are subject to electron beam damage via radiolysis, especially in a liquid environment where oxidative radicals are produced and can diffuse freely. Thus, certain embodiments of the present invention provide systems and methods to quantify and mitigate the effects of electron beam-induced changes to the sample chemistry in LP-TEM imaging. Further embodiments of the invention provide systems and methods using the electron beam as a controllable stimulus to actuate or transform materials through changes in solution chemistry, such a reduction potential or solution pH.

During LP-TEM imaging, liquid solvent (often water) is irradiated with an energetic beam of electrons with energies between 100-300 kV in a transmission electron microscope (TEM). These electrons are ionizing radiation and interact with the water to induce radiolysis, which breaks the water molecules into radical species and molecular species $H_2O \rightarrow e_{aq}^-$, H., OH., $H_2$, $H_3O^+$, $OH^-$. The solution chemistry is only altered locally within the volume of liquid that is being imaged by the TEM. The radical species include hydroxyl radicals (OH.), aqueous electrons ($e_{aq}^-$), and hydrogen radicals (H.), all of which are redox reactive. Aqueous electrons and hydrogen radicals are often employed as reducing agents to stimulate electron beam-induced nucleation and growth during LP-TEM, while hydroxyl radicals are responsible for oxidative damage of organic materials, which has been observed for carbon nanotubes, graphene and its derivatives, and biological cells. While these reactive species have the potential to cause a lot of damage to biological and soft materials, the use of graphene liquid cells or addition of radical scavengers can almost entirely mitigate their effects on experiments.

Another specific effect of radiolysis is to reduce the local solution pH during LP-TEM imaging, due to the creation of protons as a main product of radiolysis. Radiolysis kinetic simulations have shown that the pH can be decreased to a value of pH=3 within several seconds for even moderate electron beam currents. Further, pH cannot be regulated using radical scavengers or buffers because the generation rate of protons far exceeds to rate of buffering reactions. pH controls many important nanoscale processes, including activity of enzymes, stability and crystallization of proteins, protein-protein interactions, protein confirmation, crystallization and phase transformations in minerals (e.g. calcium carbonate, and cellular activity). Interpreting LP-TEM images of these materials without specific knowledge of the electron beam modified solution pH is not possible. Beam-induced pH change could also be harnessed as a controllable stimulus. For instance, the nanoscale dynamics of pH responsive hydrogels or pH induced mineral crystallization could be investigated by systematically controlling local solution pH with the electron beam. Finally, the ability to measure solution pH as a function of imaging conditions will enable establishing imaging conditions that minimize electron beam-induced solution chemistry changes. Taken together, these facts indicate that there is a critical need to measure the effects of the electron beam on local pH in the imaging area and surrounding areas during LP-TEM. While recent simulations have predicted changes to solution chemistry due to radiolysis during LP-TEM imaging, there have been no direct experimental measurements of radiolysis products.

Local pH measurement during LP-TEM imaging is inherently challenging from both engineering and scientific perspectives. The pH must be probed, for example, in a microfluidic cell 10 containing a femtoliter volume of liquid between a pair of LP-TEM microchips 14 to probe the pH in a region 18 where the LP-TEM image is being acquired, as illustrated by way of example in FIG. 1a, which shows an electron beam 20 scanning the sample within region 18 (red arrows showing possible scanning directions in FIG. 1a). In various embodiments the region 18 may be between the range of approximately 100 nm by 100 nm to approximately 20 μm by 20 μm, although other sizes for the region 18 are possible. In general, global pH measurements in the larger microfluidic channels will not resolve these local pH changes as they will be averaged out due to the microliter volume of liquid contained in the entire microfluidic system. Conventional pH electrodes are ion sensitive electrodes (ISE), such as the glass pH ISE; however, these electrodes are multilayered and contain ion conductive gel layers, which would be impossible to fabricate on microchips with even state of the art microfabrication techniques. There are several optical techniques for measuring solution pH, such as pH-dependent fluorophores and Raman spectroscopy, but these probes do not have sufficient spatial resolution to measure pH in the local image area and instead measure global pH in the microfluidic device.

Conductivity measurements may be used to measure creation of ionic radicals during pulsed radiolysis experiments. Conductivity measurements may be performed by inserting sets of electrodes into the irradiated liquid sample and measuring sample conductivity during irradiation. These measurements rely on the fact that only a few ionic species are formed during radiolysis; for pure water this includes aqueous electrons, protons, and hydroxide ions. This conventional measurement requires that the concentration of radical species throughout the liquid sample is constant and that there are no concentration gradients, which poses a major challenge for adapting conductivity measurement to LP-TEM. An electron beam 20 only irradiates a very small portion of the sample at a time during LP-TEM imaging and so there may be significant concentration gradients of radiolysis species and solution pH/protons.

Electrochemical impedance spectroscopy (EIS) is an electrochemical measurement technique utilized to probe the electrochemistry of liquids, solids, and interfaces. Briefly, EIS can measure the equivalent resistances and capacitances associated with different chemical processes and materials properties. In an EIS measurement, a small variable (e.g. sinusoidal) electric potential is applied to the sample, and the resulting sinusoidal current is measured and used to determine an impedance. The impedance is a complex number, $Z=Xj+R$, where X is the reactance, a measure of the phase shift of the sinusoidal current with respect to the applied potential, and R is the resistance, a measure of the amplitude of applied potential divided by the resulting current. Among many parameters that can be measured with EIS, the solution resistance ($R_\Omega$) of an electrolyte or liquid is readily measured with EIS by fitting an equivalent circuit to the EIS data. Typically, the low frequency impedance is most representative of the solution resistance. The solution resistance is the inverse of the solution conductance, $G=R_\Omega^{-1}$, which is related to the solution conductivity, σ, by a geometric cell constant, χ, determined by the geometry and separation of the electrodes, $\sigma=\chi G$. This geometric cell constant is simply obtained by determining the conductance of solution with known solution conductivity.

pH is a measure of the proton concentration, $c_{H^+}$, in an aqueous electrolyte, $pH=-\log c_{H^+}$. Therefore, solution conductivity is directly related to pH by $\sigma=\Lambda_{H^+,0} \exp(-pH)+\Lambda_{OH^-,0}c_{OH^-}+\Lambda_{A^+,0}c_{A^+}+\Lambda_{B^-,0}c_{B^-}$, where $\Lambda_{i,0}$ are the limiting molar conductivities of each species (known constants), $A^+$ represents any cation and $B^-$ represents any anion comprising a background electrolyte. The conductivity of a solution with constant background electrolyte concentration and variable pH will be lowest at pH=7 and largest at low pH and high pH, due to the autodissociation of water reaction, $OH^-+H^+\to H_2O$. At pH=7, protons and hydroxide ions are present in equal amounts, which shifts the equilibrium of the autodissociation reaction to right and produces a minimum in the solution conductivity (maximum in the solution resistivity). An increase or decrease in solution pH away from neutral pH will increase the solution conductivity, which may be detected with a conductivity measurement.

Solution conductivity-based pH measurement requires selectively measuring conductivity changes which arise due to protons. Three ionic species are created during radiolysis: aqueous electrons ($e_{aq}^-$), protons ($H^+$), and hydroxide ions ($OH^-$), whose concentrations must satisfy charge neutrality, $[e_{aq}^-]+[OH^-]=[H^+]$. Prior simulations have shown that reactive radicals, such as aqueous electrons ($e_{aq}^-$), do not diffuse farther than about 50 nanometers (nm) from the LP-TEM imaging area 18, whereas protons diffuse several microns (μm) away from the image area. Accordingly, instead of positioning electrodes 30, 32, 34 to directly encompass the LP-TEM imaging area, in various embodiments the electrodes 30, 32, 34 may be positioned several microns away from the imaging area 18 for at least two reasons. The first reason is that space-charge created by emission of secondary electrons from the sample leads to positive charge being built up in the silicon nitride. If the electrodes 30, 32, 34 were placed near the electron beam 20, an overall decrease in impedance would be measured due to this effect, which may dominate any changes to solution conductivity. The second reason is a matter of selectivity: by positioning the electrodes 30, 32, 34 relatively far from the LP-TEM imaging area, the highly reactive aqueous electrons, $e_{aq}^-$, cannot diffuse to the electrodes 30, 32, 34 due to their short lifetime of ~50 μs before they recombine with another species. In various embodiments, the electrode 30 can be placed between approximately 200 nm and approximately 10 μm from the region 18. In various embodiments, the electrode 32 may be placed between approximately 1 μm and approximately 200 μm from the electrode 30. Only protons and hydroxide ions will diffuse to the electrodes 30, 32, 34; however, the hydroxide ion concentration and diffusion coefficient are smaller than the proton concentration, so this effectively allows measurement of impedance changes resulting from changes in solution pH (proton concentration). Therefore, solution impedance in the vicinity of the LP-TEM imaging area 18 will be affected largely by the proton concentration and will provide a measure of solution pH.

Control EIS Experiments Outside the TEM

Figure 1B:
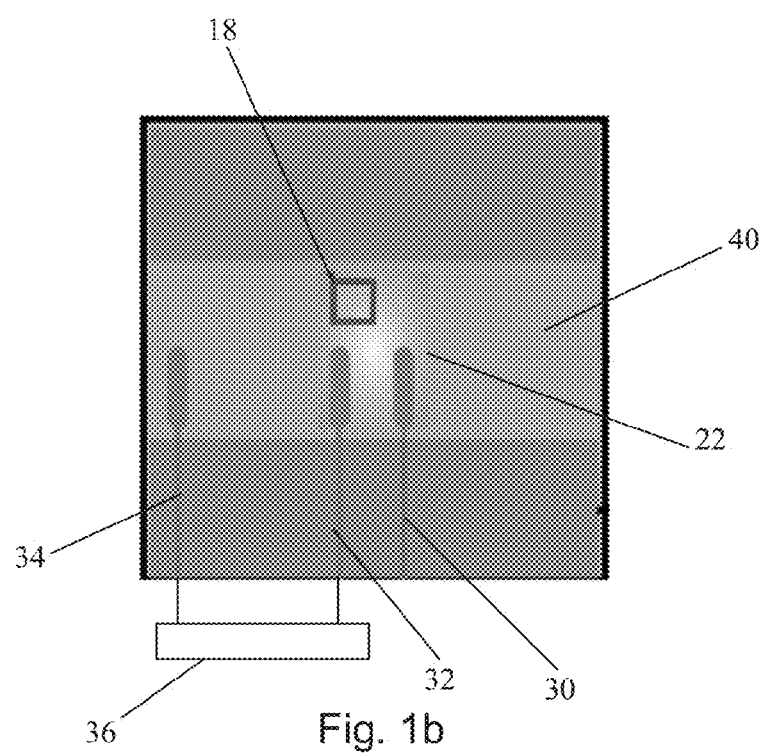

Commercially-available microelectrode chips can be used to perform EIS measurements of solution resistance during LP-TEM imaging. With reference to FIG. 1b, in some embodiments, the sample cell 10 may include two silicon microchips 14. The microchips 14 each include an opening, such as a rectangular hole etched in silicon, for example, over which is attached a 50 nm silicon nitride membrane 22 to create a free standing membrane for TEM observations. In some embodiments, the membrane 22 can include one or more of silicon nitride, silicon oxide, or silicon. Three microelectrodes 30, 32, 34 (e.g., made of a conductive material such as platinum, carbon, or gold) may be patterned onto one of the membranes 22 and/or sample chips 14, each electrode having dimensions of approximately 5×50 μm and a thickness of approximately 75 nm, although other dimensions are possible. In some embodiments, one or more of the electrodes 30, 32, 34 may have a range of dimensions, such as 1×5 μm to 5×50 approximately. In one embodiment, two of the electrodes 30, 32 are patterned onto the silicon nitride membrane 22, while the third electrode 34 may be patterned onto a microchip 14 in the flow channel 40 at a position approximately between 1 μm and 200 μm away from the first electrode 30. The first electrode 30 may be a reference electrode, the second electrode 32 may be a working electrode, and the third electrode 34 may be a counter electrode. A potentiostat 36 may be in communication with the second electrode 32 and the third electrode 34; in addition, operation of the potentiostat 36 may be performed with reference to the first electrode 30. In the embodiment shown in FIG. 1b, the liquid layer thickness is approximately 1 μm; however, other thicknesses are possible, such as between approximately 100 nm to 10 μm. In some embodiments, the other microchip 14 can include 500 nm insulating posts. Further, the microfluidic cell 10 is hermetically. In some embodiments, the microfluidic cell 10 is hermetically sealed with O-rings; however, other methods of hermetic sealing are possible, such as using an adhesive, for example. The electrodes 30, 32, 34 can be connected to an external high precision EIS instrument.

Figure 1C:
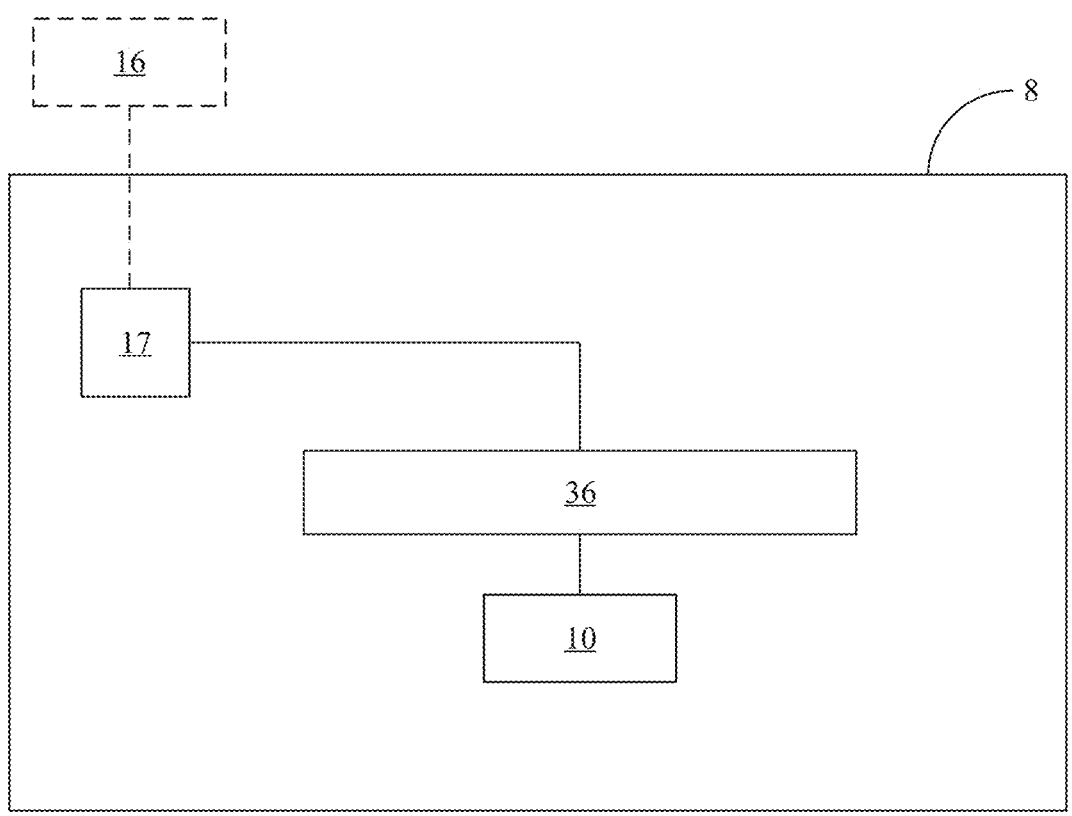
FIG. 1c is a schematic system diagram of an LP-TEM imaging system according to an embodiment of the invention.

Accordingly, FIG. 1c shows a block diagram of one possible system for carrying out the procedures disclosed herein. With reference to FIG. 1c, some embodiments of the invention include an LP-TEM system 8. The LP-TEM system 8 may include the microfluidic cell 10 having sets of electrodes 30, 32, 34 (see, for example, FIGS. 1a, 1b) in communication with the potentiostat 36. The potentiostat 36 may be in communication with a controller 17 that is configured to induce the potentiostat to produce and apply a varying (e.g. sinusoidal) electric potential, as will be described in detail below. The controller 17 may be further configured to collect and process data measured at one or more of the electrodes 30, 32, 34. Although the embodiment depicted in FIG. 1c shows the LP-TEM 8 as including the potentiostat 36 and the controller 17, either or both of the potentiostat 36 and/or the controller 17 may be separate from the LP-TEM system 8 and may communicate with the LP-TEM system 8 via suitable connections. In some embodiments the system 8 and/or the controller 17 may include or be in communication with an external electrochemical impedance spectroscopy instrument 16.

Figure 2A:
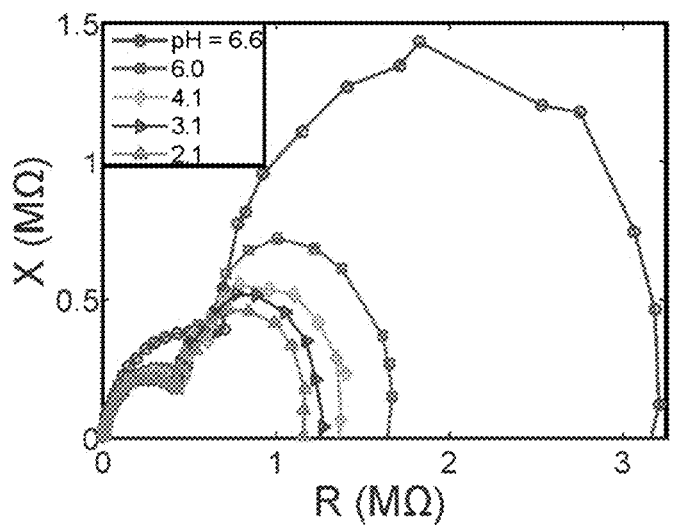
FIG. 2a is a Nyquist plot for different pH solutions for a frequency range of 1 Hz-100 kHz that illustrates the effect of solution pH; the microelectrode EIS measurement was taken outside the sample cell of FIG. 1a of 10 mM $KClO_4$ with different solution pH; the pH was varied by adding amounts of 1 M HCl.
Figure 2B:
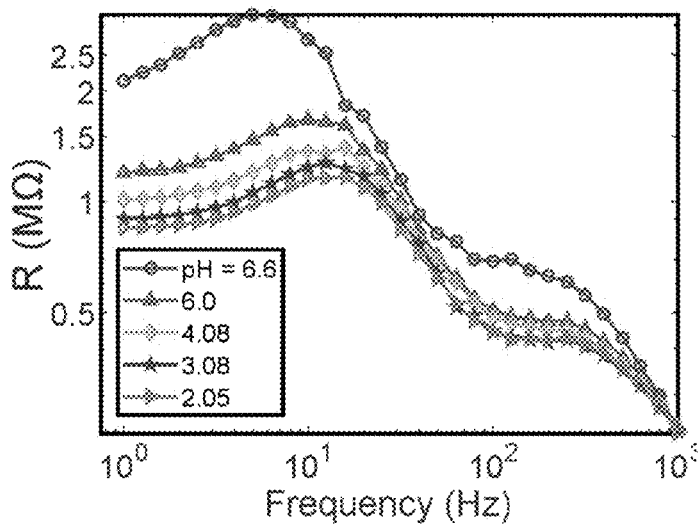
FIG. 2b are Bode plots of the low frequency solution resistance for different pH solutions.
Figure 2C:
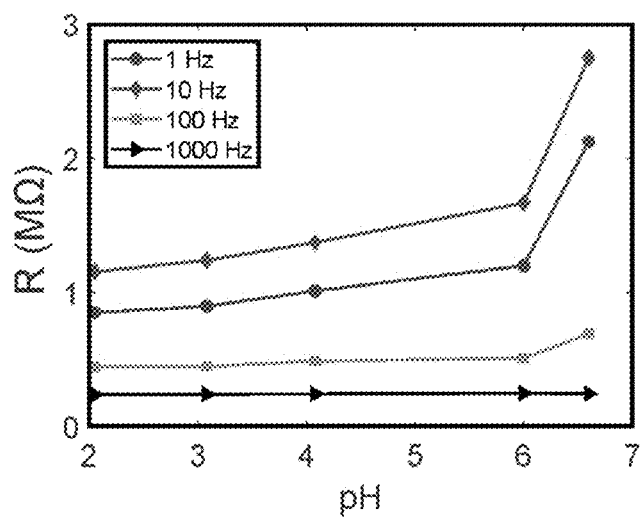
FIG. 2c is solution resistance as a function of pH for several different EIS frequencies.

Referring now to FIGS. 2a, 2b, and 2c, EIS measurements using the microelectrodes can be performed initially outside of an electron microscope to determine the sensitivity of the measurement to pH change. The pH of aqueous solutions containing 10 mM potassium perchlorate background electrolyte can be varied by adding different amounts of 1 M HCl or 1 M NaOH to obtain solutions with pH values ranging from 2-10 and nearly identical background electrolyte ionic strength which are then used to determine reactance as a function of resistance (FIG. 2a); resistance as a function of frequency (FIG. 2b); and resistance as a function of pH (FIG. 2c).

Figure 3A:
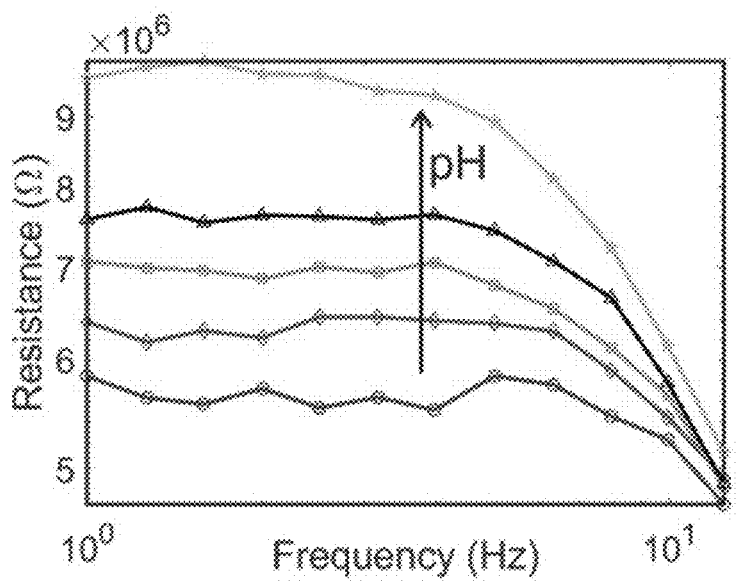
FIG. 3a is solution resistance as a function of frequency for various solution pH values; the solution is 10 mM KClO$_4$ and the pH is adjusted by adding various amounts of 1 M HCl.
Figure 3B:
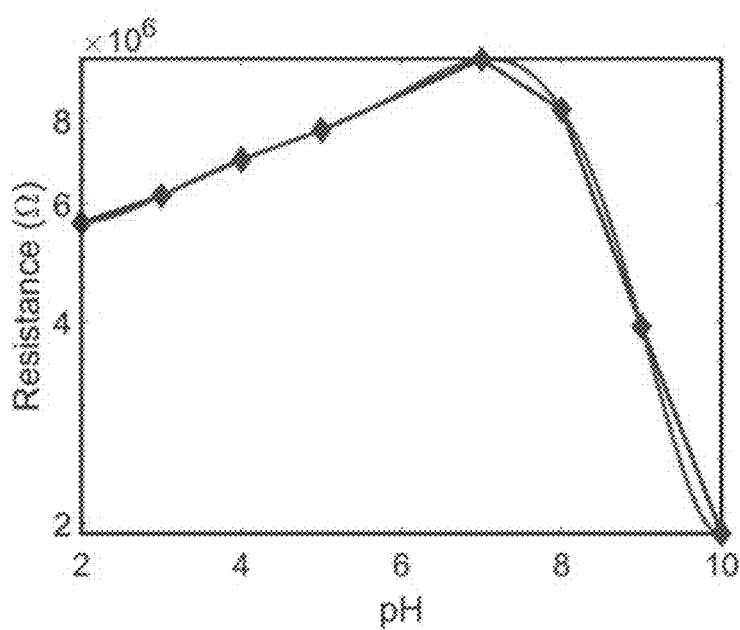
FIG. 3b is solution resistance as a function of pH for an EIS frequency of 1 Hz; the blue data points are EIS measurements and the red line is a polynomial fit to the data.

Referring now to FIGS. 3a and 3b, EIS measurements can be taken in a microelectrode cell over the frequency range of 1 Hz-100 kHz with an AC voltage amplitude of 10 mV as shown in FIG. 3a. In other embodiments, the AC voltage amplitude can be between 5 and 50 mV. The change in solution resistance as a function of pH changed as a function of EIS frequency, with the sensitivity of solution resistance to pH increasing with decreasing frequency. An applied current having a frequency of 1 Hz may be used to maximize the sensitivity of solution resistance to solution pH as shown in FIG. 3b. Plotting the solution resistance as a function of solution pH illustrates the expected trend as described above; the experimentally measured solution resistance is at a maximum at pH=7 and decreases as the pH increases or decreases away from neutral pH. This calibration result illustrates broad sensitivity to pH changes across the entire pH range; sensitivity will be lowest near neutral pH where conductivity changes slowly with pH.

Finite Element Analysis Simulations of Solution pH in the Microfluidic Cell

Finite element analysis (FEA) simulations of the pH inside the LP-TEM microfluidic can be performed using COMSOL. These simulations can determine the solution pH gradient throughout the entire microfluidic device and will enable back-calculating the solution pH in the image area based on the pH that is measured using EIS. The FEA simulations can solve the reaction-diffusion equation in a finite 2-dimensional domain and account for the creation of protons inside the TEM image area by the electron beam 20, their diffusion across the microfluidic cell 10, and their recombination with hydroxyl ions outside of the TEM image area. The simulations can capture the actual diffusion coefficients and reaction rates of each species and the geometry of the microfluidic cell; thus they can be expected to have predictive power in terms of determining solution pH.

Figure 4:
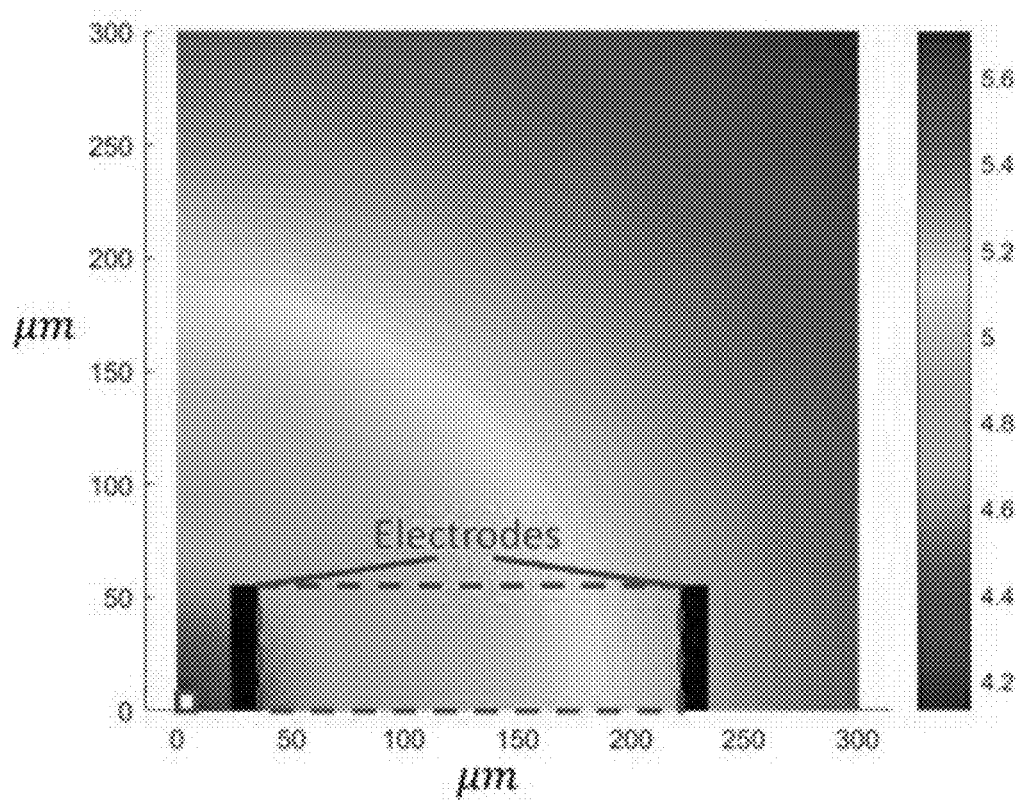
FIG. 4 is a finite elemental analysis model of a pH distribution within the microfluidic chamber of FIG. 1a; the image size is 10×10 μm and located in the white rectangle in the bottom left of the image; the pH in the image area for this simulation was 4; the black rectangles denote the approximate position of the microelectrodes; the red dashed region denotes the region of the microfluidic cell where the EIS measurement is taken.

FIG. 4 shows a heat map of a simulated solution pH in the microfluidic cell 10 for a pH of 4 in the TEM image area (bottom left, corresponding to region 18 shown in FIGS. 1a, 1b) based on a FEA simulation. The positions of the EIS electrodes 32, 34 are shown with black bars. The pH increases as a function of distance from the TEM image area because of finite proton diffusion and proton recombination with hydroxyl ions. As can be seen in the image, there is a pH gradient within the region that EIS measurements are taken; the pH ranges from 4.5-5.2. With knowledge of the pH distribution within the region where EIS measurements are taken, the total concentration of protons in this area can be determined through integration and the effective resistance between these two electrodes 32, 34 determined. Based on this calculation, the pH in the TEM image area can then be back calculated.

FEA Simulations Demonstrates Selectivity to Solution pH

Figure 5C:
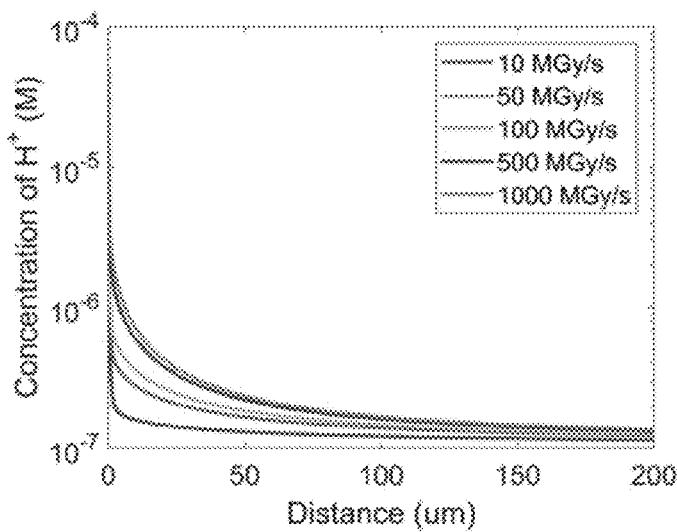
FIG. 5c is a finite element analysis of an aqueous electron concentration as a function of position along the x-axis from the center of the image area (x=0, y=0).
Figure 5B:
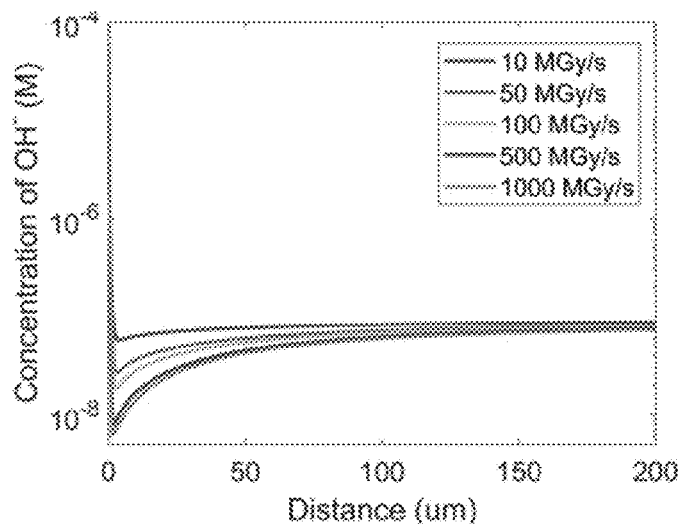
FIG. 5b is a finite element analysis simulation of a hydroxide ion concentration as a function of position along the x-axis from the center of the image area (x=0, y=0).

FEA simulations can be performed to measure the spatial distribution of various ionic species throughout the sample cell 10 and in reference to the image area and EIS electrodes 32, 34, as illustrated in FIGS. 5a, 5b, and 5c. The simulations support the assertion that the EIS electrodes measure conductivity changes predominantly due to protons and no other aqueous species. A significant portion of the protons created by the electron beam 20 reach the microelectrodes 30, 32 due to their large diffusion coefficient, as illustrated in FIG. 5a. Hydroxide ions created by the electron beam 20 also reach the microelectrodes 30, 32 by diffusion, as illustrated in FIG. 5b, but have a lower ionic conductivity and diffusion coefficient than protons by a factor of 2.5 times, indicating the conductivity measurement will predominantly capture the effect of the protons on conductivity. Aqueous electrons ($e_{aq}^-$) recombine rapidly outside of the irradiated area, which ends at x=0.3 μm, indicating they do not contribute to changes in the solution conductivity between the microelectrodes, as illustrated in FIG. 5c.

Figure 6A:
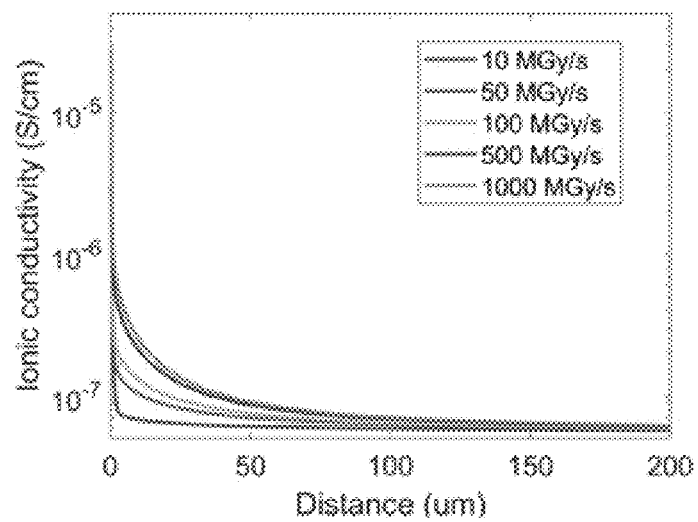
FIG. 6a is a finite element analysis of ionic conductivity of a solution as a function of position along the x-axis from the center of the image area (x=0, y=0).
Figure 6B:
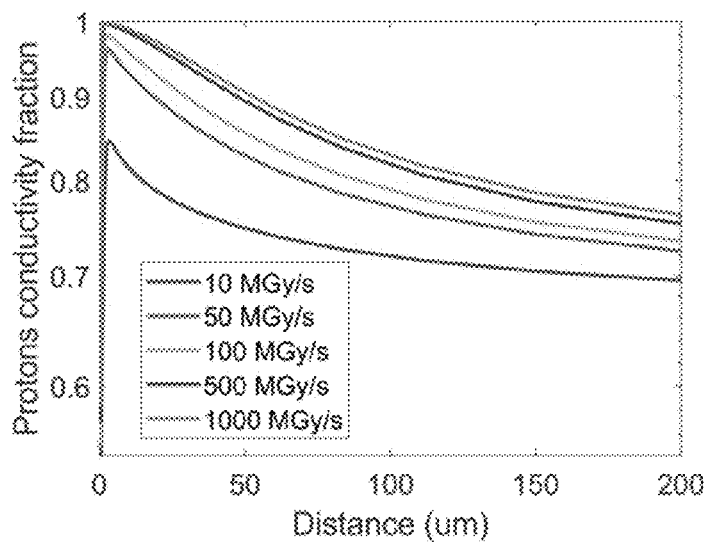
FIG. 6b is a finite element analysis of a fraction of ionic conductivity from protons of the solution as a function of position along the x-axis from the center of the image area (x=0, y=0).
Figure 6C:
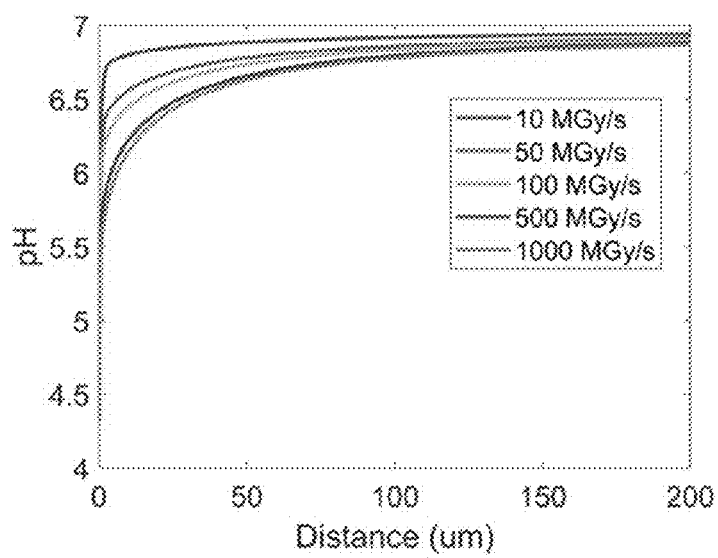
FIG. 6c is a finite element analysis of pH of the solution as a function of position along the x-axis from the center of the image area (x=0, y=0).

In order to utilize a conductivity (or resistance) based measurement for determining solution pH, it must be confirmed that conductivity changes are predominantly due to protons in solution. EIS measures the solution resistance, which is inversely proportional to the solution conductivity. The FEA simulations show that the solution conductivity is highest in the region 18 where the electron beam scans and the TEM image is taken and decreases as a function of distance from the image region, as illustrated in FIG. 6a. The conductivity is high near the image area due to the excess protons and hydroxide ions and decreases with distance from the image area due recombination of protons and hydroxide ions to form water molecules. The simulations show that the recombination rate is slower than the diffusion rate and that the conductivity is still elevated even hundreds of microns away from the image area. FIG. 6b shows that the fraction of the ionic conductivity due to protons is >70% in the region measured by the microelectrodes. FIG. 6c shows that the solution pH is acidified near the image area and increases as a function of distance away from the irradiation area. These simulations indicate that the approach of using conductivity to measure solution pH during LP-TEM is feasible by demonstrating significant changes to pH and ionic conductivity outside of the direct image area in the vicinity of the remote microelectrodes 30, 32, 34 and that these changes are predominantly due to protons created by the electron beam 20.

FEA Calibration of Measured pH to LP-TEM Image Area pH

Figure 5C:
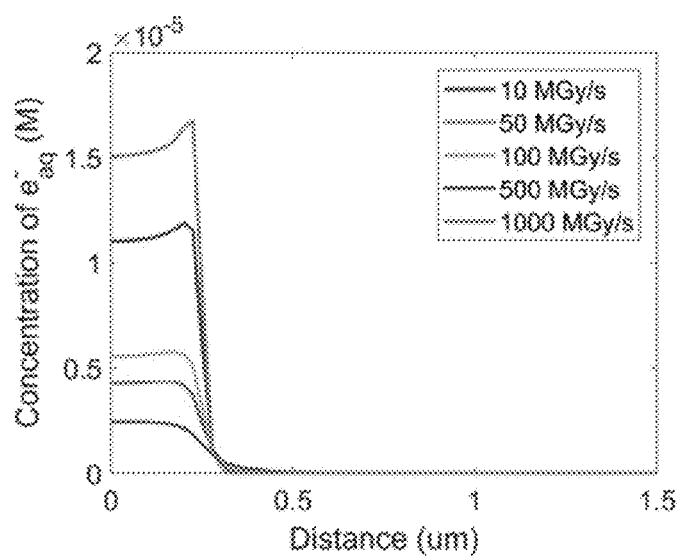

Additional calibration curves are needed to convert EIS measurements of average pH between the microelectrodes to pH in the image area. Raw EIS resistance measurements are converted to average pH measurements between the microelectrodes using the experimental calibration curve shown in FIGS. 3a and 3b. However, as shown in FIG. 5, the pH between the two microelectrodes 32, 34 may be higher than in the image area due to recombination of protons as they diffuse to the electrodes 32, 34. FEA simulations are used to create a second calibration curve that converts the average pH between the microelectrodes 30, 32, 34 into the image area pH, which is the measurement of interest. FIG. 6c shows a plot of the image area pH as a function of the average pH in between the microelectrodes 30, 32, 34. By applying this calibration curve along with the experimental calibration of solution resistance, the pH in the image area can be readily calculated. Note that this FEA generated calibration curve will change slightly depending on the exact geometry and parameters used for the LP-TEM experiment, e.g. the image magnification, dose rate, and electrode geometry. However, because the electrodes are very far apart compared to the size of the image region, the FEA calibration curve is not expected to change significantly.

In Situ EIS Measurements During LP-TEM Imaging

In some embodiments, in situ EIS measurements can be demonstrated on a LP-TEM sample consisting of pH=7 water and 10 mM KClO$_4$. The magnification and electron beam current can be systematically varied during LP-TEM imaging to vary the dose rate and measure the solution resistance changes between the microelectrodes. In one example, the open circuit potential was measured for 10 seconds and solution impedance for 10 seconds with the electron beam turned off. The electron beam was then turned on and scanned across the sample using scanning transmission electron microscopy (STEM) mode and the solution resistance measured for approximately 100 seconds or until the solution resistance reached steady state. The beam was then turned off and liquid was flowed through the cell for 10 minutes to replace the irradiated liquid with fresh electrolyte. In some embodiments impedance is measured at low frequency (~100 Hz) to eliminate polarization resistance, however bubbles may form due to significant electrolysis during in situ experiments making reliable EIS measurements difficult or impossible. In some embodiments, the impedance at 5 kHz can measure resistance without any bubble formation. While there is significant concentration polarization resistance occurring at this higher frequency, this is inconsequential because resistance is changed only due to changes in ionic strength of the solution.

Figure 7:
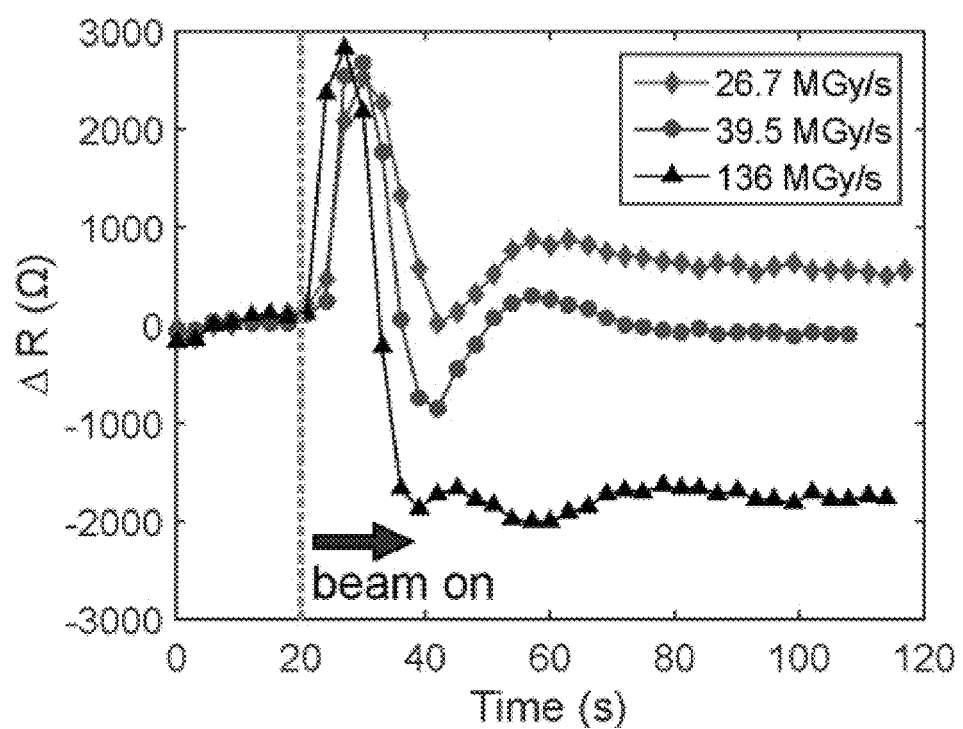
FIG. 7 is a time dependent EIS measurement of change in solution resistance (ΔR) at 5 kHz during LP-TEM imaging for different dose rates.

FIG. 7 shows typical transients for resistance change resulting from imaging the solution at a magnification of 80,000× and with 3 different electron beam currents. The change in resistivity (ΔR) is reported here to normalize all measurements to their respective baseline, because small drifts were observed in baseline impedance over time. The LP-TEM images were taken approximately 10 μm away from the working electrode 30 and 250 μm from the counter electrode 34 in these experiments (see FIG. 1b). The resistance initially increased drastically when the electron beam was turned on, but then decayed to a steady state value after 30-40 s. If this is truly due to diffusion of protons, the time to reach steady state should be approximately equal to the diffusive time scale required for protons to diffuse from the electron beam irradiated area to the remote electrodes. A simple scaling estimate indicates that the associated diffusive length scale of a proton in water over 30 seconds is $$l = \sqrt{Dt} = \sqrt{9*10^{-9}\frac{m^2}{s}*30\ s} \approx 500\ \mu m,$$

which is within a factor of two of the distance between the counter electrode and the irradiated area.

Figure 8A:
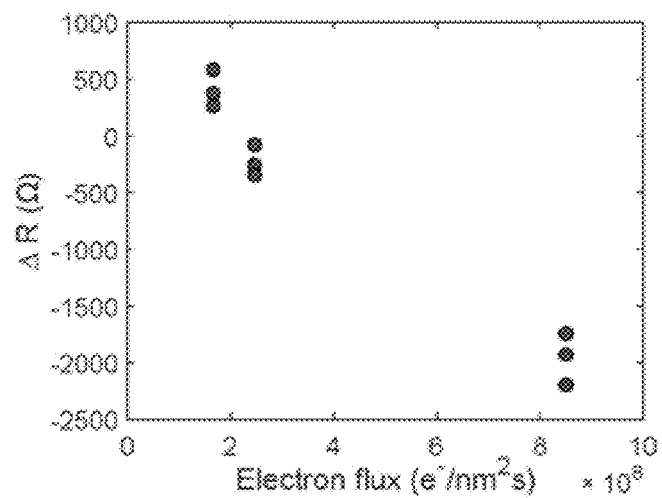
FIG. 8a is a steady state resistance change, ΔR, as a function of electron flux at constant image magnification of 80,000.
Figure 8B:
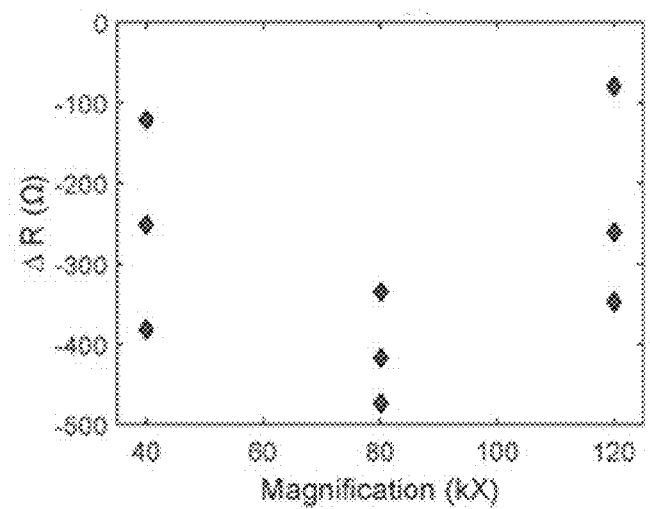
FIG. 8b is a steady state resistance change, ΔR, as a function of magnification of electron flux of $$2.2 \frac{e^-}{nm^2 s}.$$
Figure 8C:
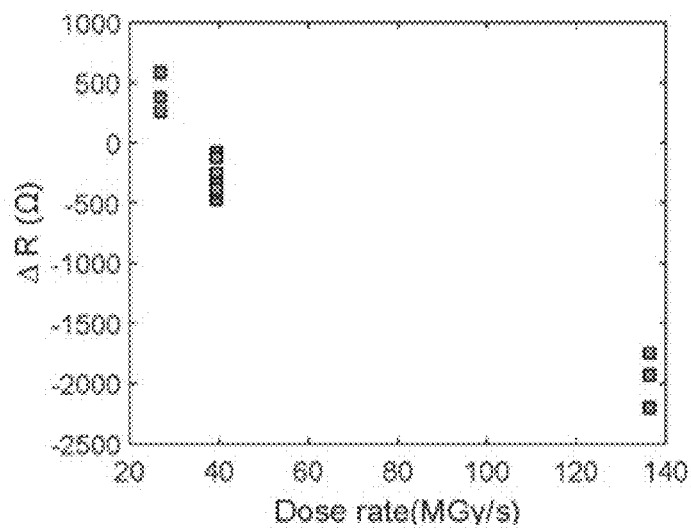
FIG. 8c is a steady state resistance change, ΔR, as a function of dose rate.

The electron beam current and the magnification can be systematically varied to determine their effects on the steady state resistance change. In general, the steady state change in resistance decreases approximately linearly as a function of electron beam current (FIG. 8a). For low electron beam currents, the change in resistance can be positive, indicating a slight decrease in solution conductivity. Conversely, magnification has almost no effect on the resistance change (FIG. 8b). However, it is hypothesized that increasing the magnification will increase the relative number of radicals produced in solution because radiolysis and beam damage depends on the area averaged electron dose rate (i.e. beam current divided by imaging area, $e^-/Å^2s$). In general, change in resistance is universally scaled with the dose rate (d) (FIG. 8c), a parameter that takes into account the effects of both beam current and magnification on the overall flux of electrons entering the liquid during LP-TEM imaging.

Direct measurement and simulation of radiolysis induced pH changes during LP-TEM imaging can be demonstrated by taking advantage of selective diffusion of protons away from the image area. Remote platinum microelectrodes can be used to make EIS measurements of the solution resistance. Control experiments with benchtop conductivity and microelectrode EIS measurements can demonstrate that solution conductivity (or resistance) can be used to sensitively measure local solution pH during LP-TEM imaging with an upper detection limit of pH=7.5. Extensive FEA simulations support the example that solution resistance changes at the remote microelectrodes are predominantly due to protons. A calibration curve can be generated using FEA simulations that converts the pH measured at the microelectrodes to the pH in the image area, which is the desired measurement. In situ measurements of solution resistance during LP-TEM imaging can show that the solution resistance decreases with increasing electron beam current and is constant as a function of magnification. These results demonstrate feasibility of using EIS resistance measurements and remote microelectrodes to quantify electron beam-induced pH changes during LP-TEM imaging.

Figure 9:
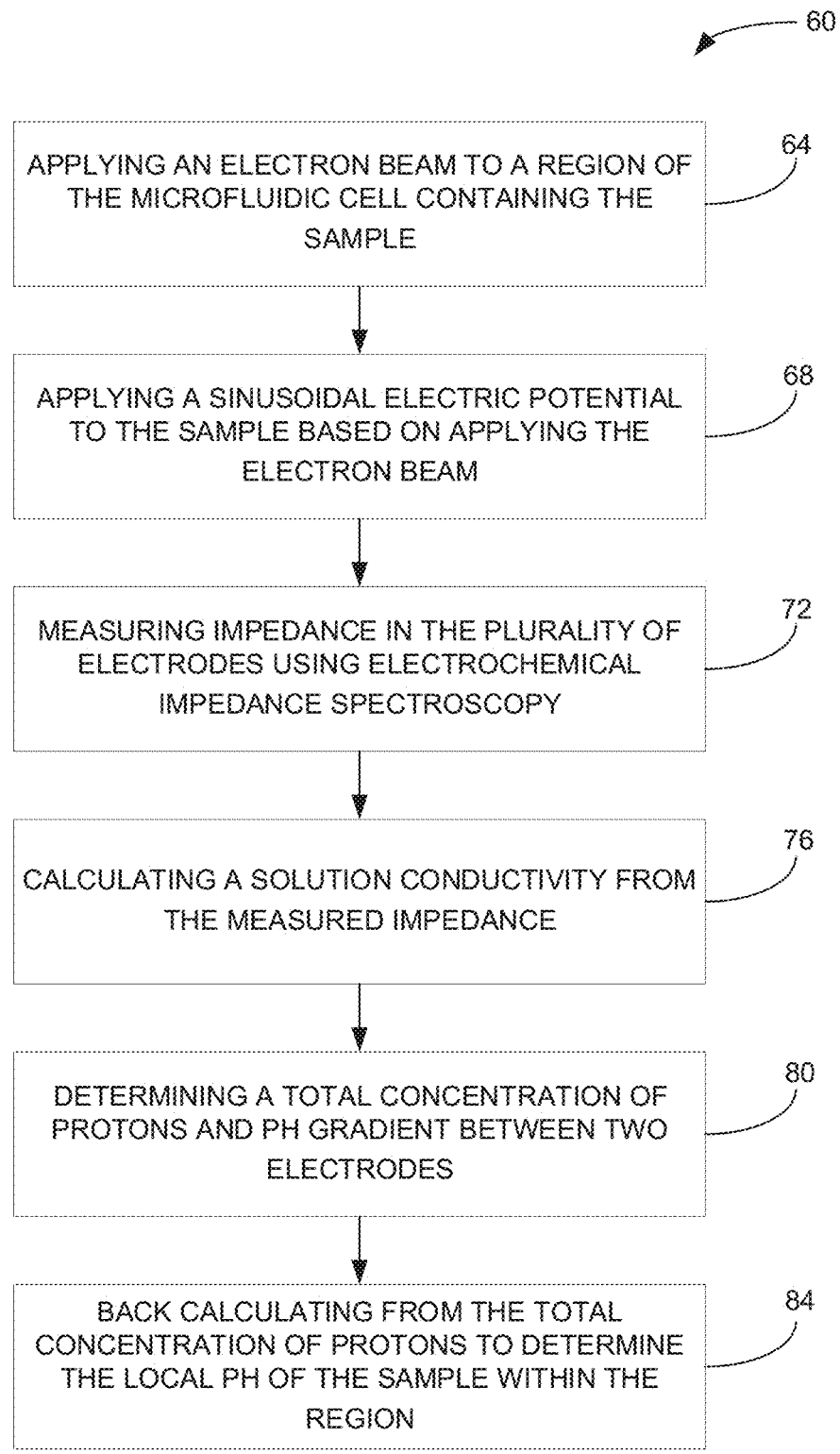
FIG. 9 is a flowchart of a method of determining local pH of a sample in a microfluidic cell.

Now that systems and methods of the present invention have been described in detail above, an example method 60 of determining local pH of a sample in a microfluidic cell according to embodiments of the invention will be described below, as illustrated in the flow chart of FIG. 9. The method 60, as illustrated in step 64, includes applying an electron beam to a region of the microfluidic cell containing the sample, the beam and microfluidic cell, similar to the beam 20 and the microfluidic cell 10, respectively, of FIGS. 1a and 1b. The method further includes applying a sinusoidal electric potential to the sample based on applying the electron beam, as shown in step 68, where the potential may be applied using a plurality of electrodes disposed within the microfluidic cell. The method further includes measuring impedance in the plurality of electrodes using electrochemical impedance spectroscopy, as illustrated at step 72, where measuring may be based on applying the sinusoidal electric potential. The method further includes calculating a solution conductivity of the sample from the measured impedance, as illustrated in step 76. The method further includes determining a total concentration of protons and pH gradient between two electrodes as shown in step 80, and back calculating from the total concentration of protons to determine the local pH of the sample within the region, as shown in step 84.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A microfluidic cell system to facilitate measurement of proton concentration in a fluid sample, the microfluidic cell system comprising:
   a first microchip and a second microchip dimensioned to permit electron beam scanning of a fluid sample;
   a first membrane attached to the first microchip;
   a second membrane attached to the second microchip, the first membrane and the second membrane being disposed adjacent to one another with a space for the fluid sample therebetween, and
   the first membrane and the second membrane including a region of the fluid sample in which an electron beam is scanned;
   a first electrode patterned onto the first membrane and positioned a first distance from the region;
   a second electrode patterned onto the first microchip and positioned a second distance from the region,
   the first distance being less than the second distance; and
   a potentiostat in communication with the first electrode and the second electrode.

2. The microfluidic cell system of claim 1, wherein the potentiostat is configured to apply a sinusoidal electric potential between the first electrode and the second electrode.

3. The microfluidic cell system of claim 2, wherein the potentiostat is configured to detect solution resistance of the fluid sample based on the applied sinusoidal electric potential.

4. The microfluidic cell system of claim 3, wherein a proton concentration in the region is determined based on the solution resistance using a finite element analysis.

5. The microfluidic cell system of claim 1, wherein the first membrane is a silicon nitride membrane.

6. An apparatus to facilitate measurement of an electron beam-induced pH change during electron microscopy, the apparatus comprising:
   a first microchip including a first microelectrode patterned thereon;
   a second microchip disposed adjacent to the first microchip to create a microfluidic channel therebetween; and
   a free standing membrane attached to the first microchip and configured for transmission electron microscopy observations,
   the free standing membrane having a second microelectrode and a third microelectrode patterned thereon.

7. The apparatus of claim 6, wherein the first microelectrode, the second microelectrode, and the third microelectrode are in electrical communication with a potentiostat.

8. The apparatus of claim 6, wherein the free standing membrane comprises a region configured for scanning of an electron beam.

9. The apparatus of claim 8, wherein the third microelectrode is approximately 200 microns away from the region.

10. The apparatus of claim 6, wherein at least one of the first microelectrode, the second microelectrode, or the third microelectrode comprises a platinum microelectrode.

11. The apparatus of claim 6, wherein the free standing membrane is a silicon nitride membrane.

12. The apparatus of claim 6, wherein the first microchip and the second microchip are hermetically sealed together.

13. The apparatus of claim 6, wherein the first microelectrode, the second microelectrode, and the third microelectrode are connected to an electrochemical impedance spectroscopy instrument.

14. A method of determining local pH of a sample in a microfluidic cell, the method comprising:
applying an electron beam to a region of the microfluidic cell containing the sample;
applying, using a plurality of electrodes disposed within the microfluidic cell, a sinusoidal electric potential to the sample based on applying the electron beam;
measuring, based on applying the sinusoidal electric potential, impedance in the plurality of electrodes using electrochemical impedance spectroscopy;
calculating a solution conductivity from the measured impedance;
determining a total concentration of protons and pH gradient between two of the plurality electrodes; and
back calculating from the total concentration of protons to determine the local pH of the sample within the region.

15. The method of claim 14, wherein the microfluidic cell includes a first silicon microchip and a second silicon microchip disposed adjacent to the first silicon microchip to create the microfluidic cell, and a membrane configured for transmission electron microscopy observations.

16. The method of claim 15, wherein the plurality of electrodes comprises a first platinum microelectrode and a second platinum microelectrode patterned on the first silicon microchip.

17. The method of claim 16, wherein the step of determining a total concentration of protons is accomplished via integration and effective resistance between the first platinum microelectrode and the second platinum microelectrode.

18. The method of claim 14, wherein the sinusoidal electric potential is applied at a frequency of between 1 Hz and 100 kHz.

19. The method of claim 14, wherein the amplitude of the sinusoidal electric potential is between 5 mV and 15 mV.

20. The method of claim 14, wherein back calculating from the total concentration of protons further comprises:
determining the local pH using a finite element analysis simulation.

* * * * *